United States Patent [19]
Horie et al.

[11] Patent Number: 5,144,627
[45] Date of Patent: Sep. 1, 1992

[54] TEST MODE SWITCHING SYSTEM FOR LSI

[75] Inventors: Nobuyuki Horie, Tenri; Toshihiro Yamanaka, Ikoma; Daiji Yamane, Tenri; Noriaki Sakamoto, Souraku, all of Japan

[73] Assignee: Sharp Kabushiki Kaisha, Osaka, Japan

[21] Appl. No.: 460,371

[22] Filed: Jan. 3, 1990

[30] Foreign Application Priority Data

Jan. 6, 1989 [JP] Japan ................... 1-1520

[51] Int. Cl.$^5$ ............................. G06R 11/00
[52] U.S. Cl. ......................... 371/22.1; 371/15.1
[58] Field of Search ............. 371/22.1, 22.2, 22.5, 371/22.6, 15.1

[56] References Cited

U.S. PATENT DOCUMENTS

| | | | |
|---|---|---|---|
| 4,546,472 | 10/1985 | Volk et al. | 371/22.1 |
| 4,697,140 | 9/1987 | Saito et al. | 371/22.1 |
| 4,742,486 | 5/1988 | Takemae et al. | 371/22.1 |
| 4,837,765 | 6/1989 | Suzuki | 371/22.1 |

FOREIGN PATENT DOCUMENTS

| | | | |
|---|---|---|---|
| 0087314 | 8/1983 | European Pat. Off. | |
| 0255449 | 2/1988 | European Pat. Off. | |
| 0100673 | 5/1986 | Japan | 371/22.1 |
| 0181978 | 8/1986 | Japan | 371/22.1 |

OTHER PUBLICATIONS

Patent Abstracts of Japan, vol. 9, No. 13 (P328) (1736) Jan. 19, 1985, * JP-A-59 160 778 (Nippon Denki KK.).

*Primary Examiner*—Jerry Smith
*Assistant Examiner*—Russell E. Cass

[57] ABSTRACT

A test mode switching system includes a register for storing test signal data and for outputting the test signal data to a self testing circuit for checking whether or not the LSI operates correctly. A memory stores a test inhibiting signal and a test allowing signal received from a CPU through the control signal terminal of the LSI. The register is enabled to output test signals depending on the condition of the output of the memory whereby the LSI can operate either under a normal operation mode or under a test mode.

2 Claims, 2 Drawing Sheets

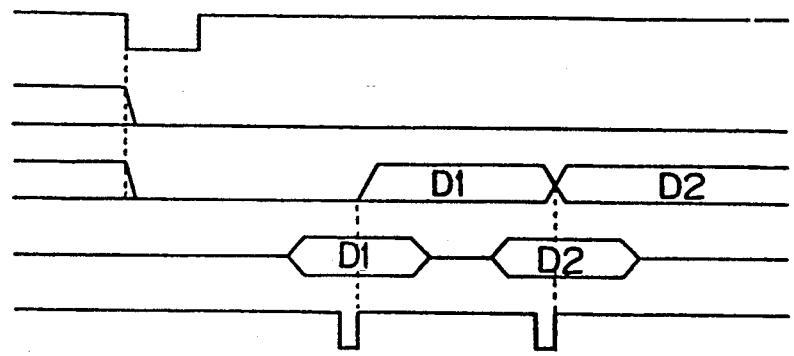

TEST MODE SWITCHING SYSTEM FOR LSI

BACKGROUND OF THE PRESENT INVENTION

1. Field of the Present Invention

The present invention relates to a test mode switching system for a large scale integration circuit or LSI to be connected to a central processing unit or CPU. The system is incorporated in the LSI to check whether or not the LSI can operate normally before leaving the factory.

2. Description of the Prior Art

In the prior art, LSI can be switched to a test mode through an external terminal of the LSI serving as a test mode switching pin of LSI as mentioned below. If the test mode pin is '1' condition which represents the test mode, the test signal data register incorporated in the LSI operates, storing test signal data inputted from the CPU through the data input pin of LSI, whereby the register outputs the data to each testing circuit in the LSI to set each testing circuit to the testing condition for checking whether or not the LSI can operate correctly. Each testing circuit is controlled by the CPU through each pin of the LSI, a control bus. The testing circuits the address bus, and transmits the data resulting from the test to the CPU through the data bus, so that the CPU can determine the functions of the LSI based on the data. Before LSIs are shipped from the factory, '0' the test mode switching pin of each LSI which has passed the above mentioned device test is made '0' which represents the normal operation mode, whereby the test signal data register is disabled, so that the LSI can work in the normal operation mode under the control of CPU.

The conventional LSIs of the above type necessitate an external pin serving as a test mode switching pin, to enable the LSIs in the test mode. LSIs are, however, limited in the number of external pins. Sometimes it is not feasible to provide even one test mode switching pin.

In the conventional LSI test mode switching device, there must be used a relatively large size LSI package to provide the test mode switching pin. The conventional LSI test mode switching device prevents a decrease in the package size.

SUMMARY OF THE PRESENT INVENTION

An essential object of the present invention is therefore, to provide a test mode switching system for LSIs in which the test mode can be enabled without any specific test mode switching pin, whereby the number of the external pin of LSI can be reduced, resulting in reduction of the LSI size.

To accomplish the above mentioned object, in the present invention, a test mode switching system for a LSI comprises a data input terminal for applying data signals used in the LSI, a control signal terminal for receiving a signal by which the LSI can be operated, an address signal input terminal for applying address data to be used in the LSI the test mode switching system includes register means for storing test signal data inputted from CPU through the data input terminal of the LSI and for outputting the test signal data to a self testing circuit for checking whether or not the LSI operates correctly, memory means for storing a test inhibiting signal and a test allowing signal received from the CPU through the control signal terminal of the LSI; and means for enabling said register means to output test signals depending on the condition of the output of the memory means and the signal applied to the address signal input terminals, whereby the LSI can operate either under the normal operation mode or under the test mode.

BRIEF DESCRIPTION OF THE DRAWINGS

FIGS. 2(a)-2(e) are a timing chart for illustrating the test mode of the LSI; and FIGS. 3(a)-3(f) are a timing chart for illustrating the normal operation mode of the LSI.

DETAILED DESCRIPTION OF PREFERRED EMBODIMENTS

Figure 1:
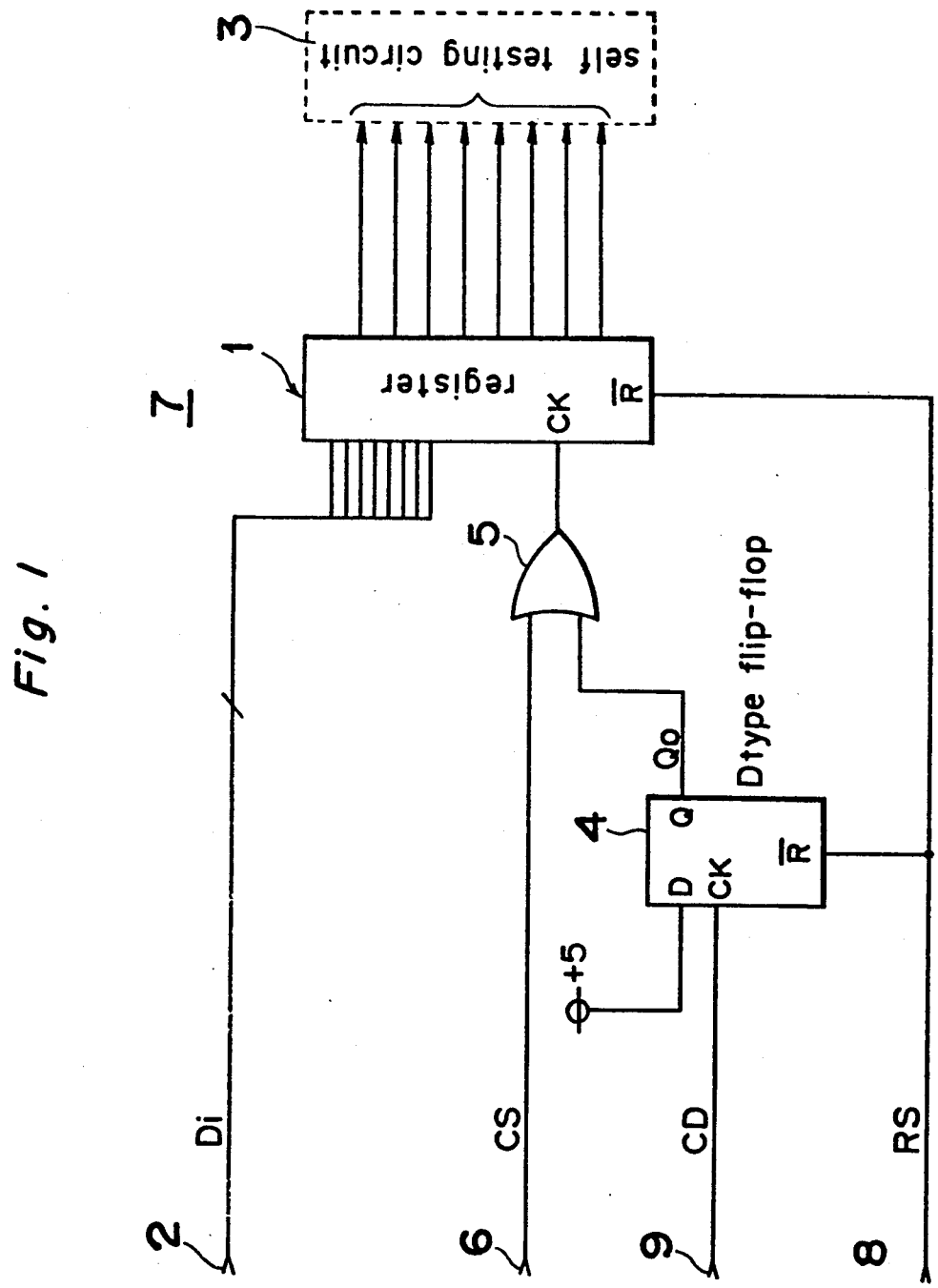
FIG. 1 is a diagram for showing one example of configuration of the substantial portion of a LSI employing the test mode switching system of the present invention.

The present invention will be described in more detail, taken in conjunction with embodiments shown in the accompanying drawings.

FIG. 1 is a schematic diagram for showing a configuration of the substantial portion of LSI which employs the test mode switching system of the present invention. Referring to FIG. 1, numeral 1 is a register which stores test signal data Di (8-bits) inputted from a CPU (not shown) through the data input terminal 2 of LSI 7, in synchronization with the rising edge of a signal inputted to a clock terminal CK. The register 1 outputs the test signal data Do (8-bits) to a self-testing circuit 3 for checking the functions of LSI 7, thereby switching the LSI 7 to the test mode operation. Numeral 4 is a D flip-flop which receives the falling edge of a reset signal RS at the reset terminal R, as a test allowing signal and outputs '0' for signal Qo. The output terminal Q then outputs if '1' is applied at an input terminal D in synchronization with the rise of the test inhibiting signal CD inputted to the clock terminal CK. The output signal Qo from the D flip-flop 4 is applied to the clock terminal CK of the register 1 through an OR gate 6 as a selection signal for enabling the register 1. The OR gate 5 also receives a selection signal CS inputted from the CPU through an address signal terminal 6 of LSI for enabling the register 1 when the signal CS rises.

The above mentioned elements 1, 3, 4, and 5 are all incorporated in the LSI 7, and the reset signal RS and the test inhibiting signal CD are inputted from the CPU to the LSI 7 through respective control signal terminals 8 and 9. The reset signal RS is also fed to the reset terminal R of the register 1. It is noted that the LSI 7 shown in FIG. 1 is not provided with any test mode switching terminal in the form of an external connection pin which the conventional LSI has. Since input terminal D of the D flip-flop 4 is normally maintained in '1' condition and outputs '1' for output signal Qo from the output terminal Q with the rising edge of the test inhibiting signal CD inputted to the clock terminal CK. The input terminal D continues to output '1' without changing to '0' even if the test inhibiting signal CD pulses again and again, as long as the reset signal RS is not inputted to the reset terminal R. In addition, the OR gate 5 outputs '1', to the clock terminal CK of the register 1 irrespective of condition of the selection signal CS, if the output signal Qo from the D flip-flop 4 is '1'. Whereas the OR gate 6 outputs the selection signal CS to the clock terminal CK of register 1, if the output signal Qo is '0'.

Accordingly, when the output signal Qo is '1', the test signal data Di from the data input terminal 2 is not written to the register 1, which therefore does not output the test signal data Do, so that the self-testing circuit 3 does not operate. The LSI 7 does not operate under the test mode. When the output signal Qo is '0', the test signal data Di is written in the register 1 in synchronization with the rising edge of the selection signal CS. The register 1'' simultaneously outputs the test signal data Do to operate the self-testing circuit 3, so that the LSI 7 can operate under the test mode.

Referring to FIGS. 2 and 3, the test mode switching system of the LSI 7 is described.

The switching to the test mode is performed in such a manner as shown in FIG. 2. When a reset signal RS as shown in FIG. 2 (a) is inputted to the LSI 7 from the CPU through the control signal terminal 8, the D flip-flop 4 and the register 1 are reset through the respective reset terminals R, so that the output signal Qo and the test signal data Do become '0' respectively, as shown in FIGS. 2 (b) and 2 (c). Next, when the selection signal CS as shown in FIG. 2 (e) is applied to the LSI 7 from CPU through the address signal terminal 6, so that the OR gate 5 outputs a signal corresponding to the logical sum of the selection signal CS and the '0' signal Qo, namely, the selection signal CS is applied to the clock terminal CK of the register 1. The register 1, then, stores the test signal data Di (Di=D1) inputted from the CPU through the data input terminal 2 with the rising edge of the selection signal CS as shown in FIG. 2 (d). The register 1 simultaneously outputs the data D1 as test signal data Do (Do=D1) to the self-testing circuit 3 as shown in FIG. 2 (c). When the next selection signal CS is inputted as shown in FIG. 2 (e), the register 1 stores the next test signal data Di (Di=D2) in the same manner as mentioned above with synchronization with the rising edge of the selection signal CS. The register 1 simultaneously outputs the data as test signal data Do (Do=D2) to the self-testing circuit 3 as shown in FIG. 2 (c). Thus, the self-testing circuit 3 is switched to the test mode operation and set to the predetermined testing conditions by the test signal data Do (Do=D1, D2), thereby checking whether or not each part of LSI 7 operates normally.

One example of the test mode is shown where a 10-bit counter in the LSI 7 is tested. In one preferred example of test of the 10-bit counter the test is conducted on the 10-bit counter as is composed of two 5-bit counters. The testing circuit 3 can rapidly complete the test of the counters by 25 clock pulses. Whereas according to a conventional test, 10-bit counter requires $2^{10}$ clock pulses to complete the test. Thus, until the test inhibiting signal CD is inputted to the clock terminal CK of the D flip-flop 4, the LSI 7 is controlled under the test mode by the CPU in accordance with the timing chart as shown in FIG. 2 and the CPU determines the operation of LSI 7 based on the data resulting from the test which is transmitted by the LSI 7 through the data bus.

The switching process to the normal operation mode is performed according to the timing chart as shown in FIG. 3. A reset signal RS as shown in FIG. 3(a) is inputted to the reset terminal R, thereby resetting the D flip-flop 4 and the register 1, so that the output signal Qo and the test signal data Do enter '0' conditions as shown in FIGS. 3 (b) and 3 (d). Next, when the CPU inputs a test inhibiting signal CD as shown in FIG. 3(c) to the LSI 7 through the control signal terminal 9, the D flip-flop 4 outputs '1' signal present at the input terminal D, as an output signal Qo, to the output terminal Q in synchronization with the rising edge of the test inhibiting signal CD as shown in FIG. 3(b). The '1', output signal Qo is not changed to a '0' signal even if the test inhibiting signal CD pulses repeatedly after that because the input terminal D of the D flip-flop 4 maintains '1' condition. The output signal Qo does not become a '0' condition until the reset signal RS is inputted to the reset terminal R of the D flip-flop 4. Since '1' output signal Qo is inputted to one of the input terminals of the OR gate 5, the OR gate 5 outputs a '1' output signal to the clock terminal of the register 1 even if the CPU inputs a selection signal CS to the other input terminal of the OR gate 5 through the address signal terminal 6 as shown in FIG. 3(f). Accordingly, even if test signal data Di (Di=D1) as shown in FIG. 3(e) is inputted to the register 1 through the data input terminal 2 with the rising of the selection signal CS, it is not written to the register 1. Furthermore, the register 1 does not output the test signal data Do as shown in FIG. 3(d). For these reasons, the self-testing circuit 3 does not operate, and hence, the LSI 7 can operate under the normal operation mode.

As described above, once the clock terminal CK of the register 1 is made '1' condition by the input of test inhibiting signal CD, the register 1 does not store the test signal data Di even if the CPU erroneously inputs the selection signal CS to the register 1 repeatedly to perform the test mode operation, so that the self-testing circuit 3 is kept in the nonoperative or disabled state, thereby assuring the normal operation mode of LSI 7. To sum up, in programming the CPU, by initially setting the test inhibiting signal CD to be outputted to the LSI 7, the LSI 7 is never changed erroneously from the normal operation mode to the test mode until the reset signal RS is outputted, even if the CPU performs an erroneous operation. Also, the systems of the CPU and the LSI 7 are not interrupted by the erroneous switching operation to the test mode.

Since the LSI 7 is switched to the test mode operation by utilizing the address signal terminal 6 and control signal terminals 9 and 8 which are generally usually provided in LSI chips and does not require a specific test mode switching terminal, it is an advantage that the LSI to be reduced in the size and hence compacted because the LSI has limitation in the number of pins in terms of its size as mentioned before.

It is needless to say that the present invention is not limited to this embodiment as described above and shown in the accompanying drawings, and the modifications and variations thereof are possible in light of the above teachings.

What is claimed is:

1. A test mode switching system for a large scale integrated circuit, the large scale integrated circuit including data input terminals for applying data signal used in the large scale integrated circuit, control signal input terminals for receiving a signal by which the large scale integrated circuit can be operated, and an address signal input terminal for applying address data to be used in the large scale integrated circuit, the test mode switching system comprising:

register means for storing test signal data inputted from an external processing unit through the data input terminals of the large scale integrated circuit, and for outputting the stored test signal data to a self-testing circuit for checking whether or not the large sale integrated circuit is operating correctly;

memory means for storing a test inhibiting signal and a test allowing signal received from the an external processing unit through the control signal input terminals of the large scale integrated circuit; and gates means for enabling said register means to output test signals to the self-testing circuit according to a condition of an output of said memory means and a signal applied to the address signal input terminal, thereby allowing the large scale integrated circuit to operate either under a normal operation mode or under a test mode.

2. The test mode switching system as claimed in claim 1, wherein said memory means is a D-type flip-flop having a clock terminal connected to the control terminal and said gate means is an OR gate having one input connected to an output of said D-type flip-flop and other input connected to the address input terminal with an output connected to an input terminal of said register means for enabling and disabling the storing of the test data signal.

* * * * *